United States Patent [19]

Heller et al.

[11] Patent Number: 4,560,922
[45] Date of Patent: Dec. 24, 1985

[54] METHOD FOR DETERMINING THE DIRECTION OF THE ORIGIN OF A DISTURBANCE AFFECTING AN ELEMENT OF AN ELECTRICAL ENERGY TRANSFER NETWORK

[75] Inventors: Isabelle Heller, Sevres, France; Paul Loewenstein, Mountain View, Calif.

[73] Assignee: Enertec, Montrouge, France

[21] Appl. No.: 665,514

[22] Filed: Oct. 31, 1984

Related U.S. Application Data

[63] Continuation of Ser. No. 324,247, Nov. 23, 1981, abandoned.

[30] Foreign Application Priority Data

Nov. 25, 1980 [FR] France .................... 80 24946

[51] Int. Cl.$^4$ .................... G01R 31/08; H02H 3/38
[52] U.S. Cl. .................... 324/52
[58] Field of Search .................... 324/51, 52, 58.5 A, 324/58.5 B; 361/82

[56] References Cited

U.S. PATENT DOCUMENTS

| | | | |
|---|---|---|---|
| 4,063,160 | 12/1977 | Lanz | 324/52 |
| 4,063,162 | 12/1977 | Lanz | 324/52 |
| 4,063,164 | 12/1977 | Lanz | 324/52 |
| 4,063,165 | 12/1977 | Lanz | 324/52 |
| 4,063,166 | 12/1977 | Glasvitsch | 324/52 |
| 4,251,766 | 2/1981 | Souillard | |
| 4,351,011 | 9/1982 | Liberman | 324/52 X |
| 4,352,137 | 9/1982 | Johns | 324/52 X |

Primary Examiner—Stanley T. Krawczewicz
Assistant Examiner—Jose M. Solis
Attorney, Agent, or Firm—Dale Gaudier

[57] ABSTRACT

A directional relay for providing indication of the direction of a fault on an electric power transfer network has an adder (9), a subtractor (10) and filters (11) which receive signals from voltage and current transformers (6,7) and derive signals related to fault-induced forward and backward transient waves on the network. To ensure reliable operation even when the relay is close to a low impedance element such as a generator (2), the forward wave related signal is delayed in a delay unit (12) by an amount equal to the propagation time of the wave along the section protected by the relay, before the difference between its square and that of the backward wave related signal are integrated (16) to derive the fault direction signal. If the protected section has a low distributed capacitance, the voltage and current signals can instead be combined by a differentiator (22) and adder (23) and filtered (11B) to produce a signal related to the forward transient wave appearing at a point X along the protected section. The integrator (16) receives the product of this signal and the filtered current signal.

11 Claims, 6 Drawing Figures

METHOD FOR DETERMINING THE DIRECTION OF THE ORIGIN OF A DISTURBANCE AFFECTING AN ELEMENT OF AN ELECTRICAL ENERGY TRANSFER NETWORK

This application is a continuation of application Ser. No. 324,247, filed Nov. 23, 1981, now abandoned.

This invention relates to a method for determining, at a measuring point situated at one end of a protected section of a part, such as an electricity transmission line, of an electrical energy transfer network, the direction, relative to that point, which indicates the origin of a disturbance affecting that part, comprising the steps of: forming, from signals indicative of the voltage and current at the measuring point, a quantity having the algebraic sign of the integral of the difference between a forward transient power wave passing the measuring point and proceeding from outside the protected section towards that section and a backward transient power wave passing the measuring point and proceeding from the protected section towards the outside, the said integral representing the total transient energy passing the measuring point; and deriving the said direction from the algebraic sign of the said quantity.

It is known that electrical energy transfer networks experience various electrical disturbances, such as connection or disconnection of generators or loads, the most serious of these disturbances, called faults, involving for example short circuits from one or several of the conductors of a line to earth, or, in the case of a polyphase network, between the conductors allocated to different phases in the same line.

To avoid the damaging effects of faults, electrical energy transfer networks are provided with detectors and complex control and command devices arranged to ensure the protection of the faulty part of the network, for example the line or the transformer, in the shortest possible time after the appearance of the fault, by disconnection of this part from the circuit.

Bearing in mind that each detector makes instantaneous measurements of voltage and current at a given point on the part of the network, it is necessary at this measuring point not only to be able to determine the existence of a fault on the part of the network but equally to be able to determine on which side of this point the fault is located.

It has been long known that the appearance of a fault on part of a network involves a transient phase change the polarity of which indicates the direction of movement and thus the direction of the origin of the fault with reference to the measuring point.

Conventionally two detectors, known as directional relays, are used, each relay being located at the opposite ends of a section to be protected of a part of an electrical energy transfer network. This section is usually chosen so as not to include any equipment likely to cause disturbances in normal operation, and each relay is arranged to detect whether or not a disturbance comes from the protected section. To this end each relay monitors, during a certain time at least after the start of every disturbance detected, the sign of the total transient energy passing the measuring point, indicated for example by the similarity or dissimilarity of the signs of the voltage and the intensity of the transient wave. For each disturbance, the directions detected by the relays are compared, for example by radio communication. If both relays indicate that the disturbance came from the protected section, steps are immediately taken to protect the part of the network concerned; otherwise, the disturbance is considered as being external to the protected section. An example of such a prior art system is shown in U.S. Pat. No. 4,251,766.

A difficulty arises in the case where the impedance upstream of the relay is low, for example, for an electricity transmission line, in the case where the only significant impedance outside the protected section is that of a large electrical generator connected to the line close to the relay.

Considering, theoretically, the total transient energy passing the measuring point as the integral with respect to time of the difference between a forward transient power wave, proceeding from outside the protected section, or upstream, towards that section, and a backward transient power wave, proceeding from the protected section towards the outside, it appears that the detection of the direction of the fault is all the more difficult since the forward and backward waves are similar in amplitude and close in time, the reason being that the sign of a positive or negative physical quantity very close to zero is fraught with uncertainty. Hence, in the case of a fault affecting the protected section and the presence of a low impedance upstream of the directional relay, the forward wave is formed by the reflection of the backward wave upstream of the relay, and these two waves have very similar amplitudes, by virtue of the almost complete absence of attenuation, and are very close in time.

There is as a result, in the determination of the direction of the origin of a fault with respect to the measuring point, a risk of error which the present invention is intended to alleviate.

The method of this invention, which comprises in known manner the operations of forming a quantity the algebraic sign of which is that of the total transient energy passing the measuring point and of deriving from the algebraic sign of this quantity the direction of the origin of the disturbance, is essentially characterised in that the said quantity has an absolute value substantially equal, apart from a constant of multiplication, to the integral of the instantaneous difference between the said forward transient power wave, delayed by a period of time between zero and twice the propagation time of a transient power wave over the protected section, and the said backward transient power wave.

It is to be understood, in the foregoing and the rest of this description, that expressions such as 'power wave', 'difference of power waves' and 'integral of the difference of power waves' can obviously mean the physical quantities thus named, but equally, for the sake of brevity, signals representative of these physical quantities.

In the case where the part of the network is a line having negligible distributed capacitance, the forward transient power wave can be obtained at any instant by deriving, from the forward transient power wave passing the measuring point at that instant and the characteristics of the line, the fraction of the forward transient power wave which, having passed the measuring point, will pass or at least ought to pass, at a later instant, a point on the protected section spaced from the measuring point, for example at the mid-point of the protected section.

Other characteristics and advantages of the invention will emerge clearly from the description thereof which follows, by way of non-limitative example, with reference to the accompanying drawings, in which.

Figure 1:
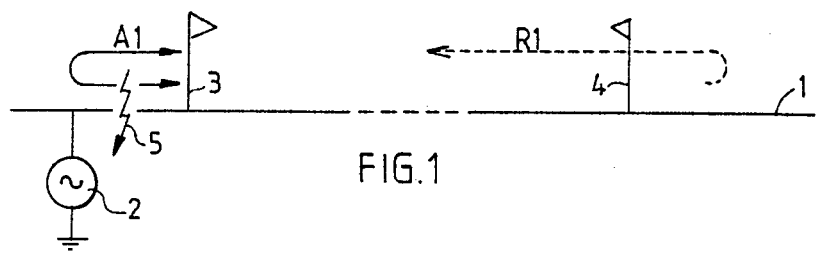
FIG. 1 is a schematic diagram representing a conductor of an electrical energy transmission line, with a section protected by two directional relays, a part of low impedance outside the protected section and a fault also outside the protected section.
Figure 2:
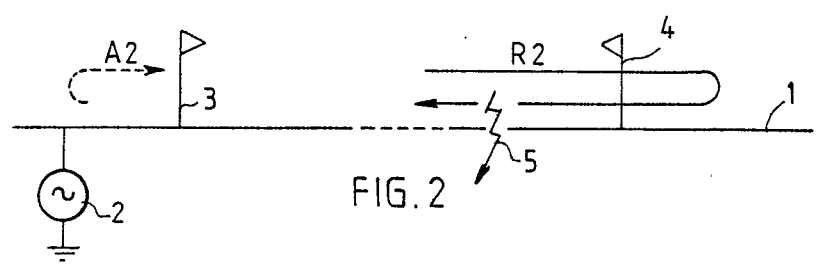
FIG. 2 is a schematic diagram representing a conductor of an electrical energy transmission line, with a section protected by two directional relays, a part of low impedance outside the protected section, and a fault within this section.
Figure 3:
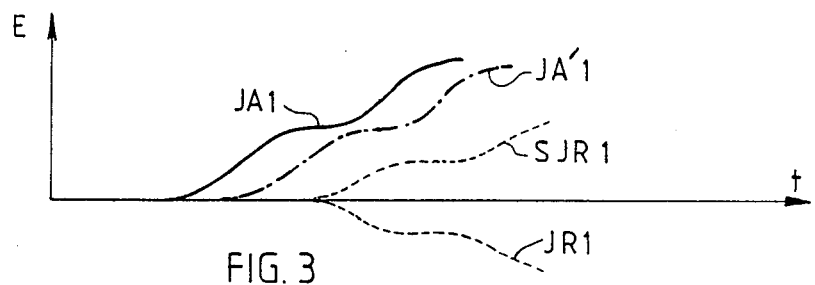
Figure 4:
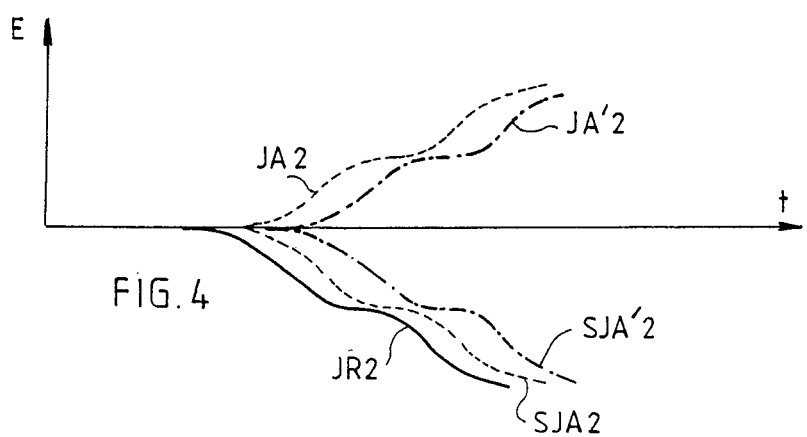
Figure 5:
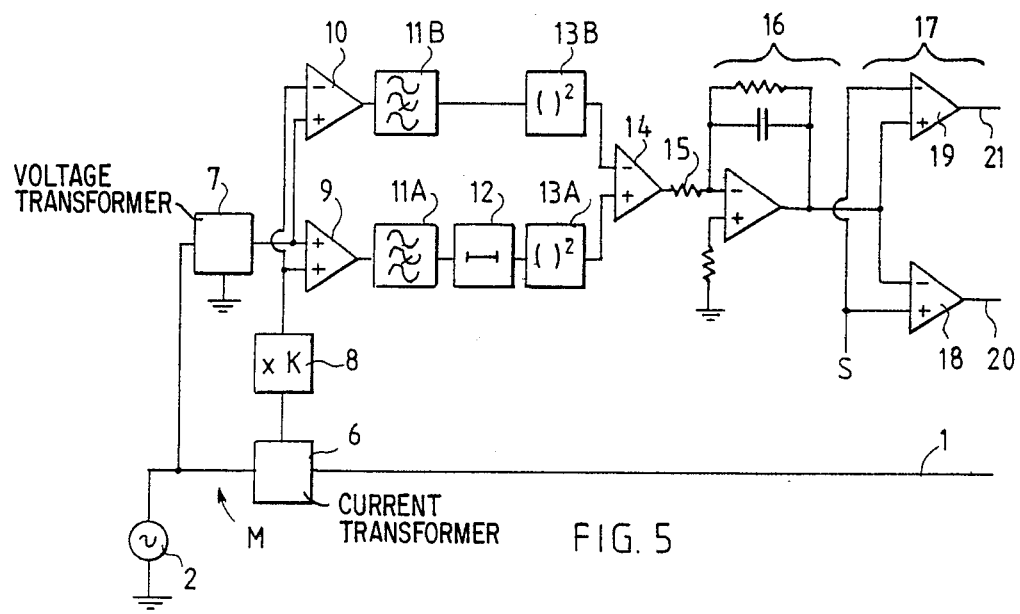
Figure 6:
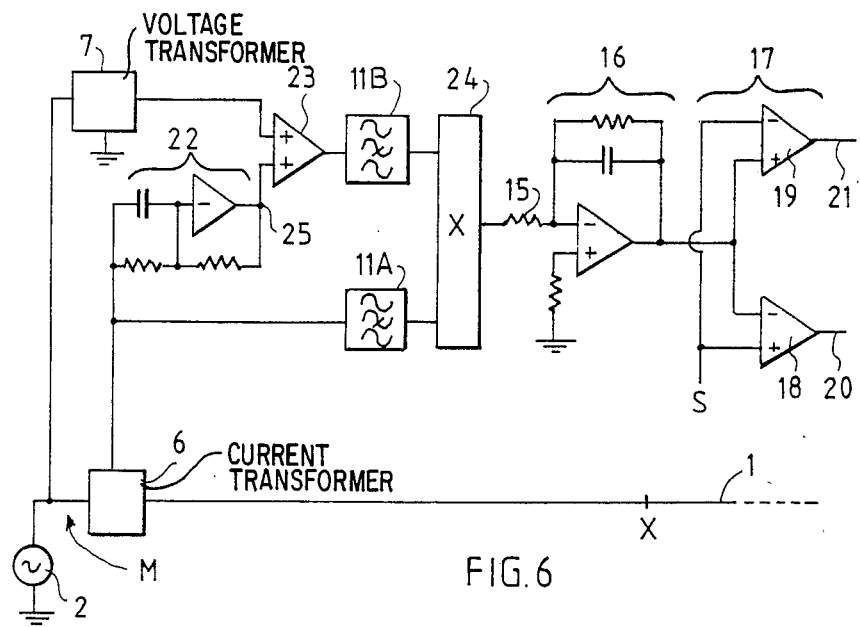

FIGS. 3 and 4 are diagrams corresponding respectively to FIGS. 1 and 2 and each showing on the positive ordinate, in terms of energy E as a function of time t, the integral of the transient power wave proceeding from outside the protected section towards that section (forward wave), and on the negative ordinate the integral of the transient power wave proceeding in the opposite direction (backward wave);

FIG. 5 is a circuit diagram of an apparatus for implementing the method of the invention; and FIG. 6 is a circuit diagram of another apparatus for implementing the method of the invention, applicable to the case of a line having negligible distributed capacitance.

FIGS. 1 and 2 show a conductor 1 of an electrical energy transmission line, an electrical energy generator 2 connected to the line, and two directional relays 3 and 4 protecting the section of the line located between them, the generator 2 having a low impedance and constituting the primary impedance upstream of the relay 3.

The conductor 1 is used to carry one phase in the case of a polyphase current, and the generator 2 is outside the protected section, close to the directional relay 3.

If a fault 5 occurs on the line between the generator 2 and the relay 3, a transient power wave A1 appears, called 'forward' because it is directed towards the protected section (arrows in full line in FIG. 1), the integral of which with respect to time has for example the form JA1 shown in FIG. 3, likewise in full line. This 'forward' wave is reflected beyond the other directional relay 4, and forms a backward wave R1 having a corresponding integral JR1 (in dashed line in FIGS. 1 and 3).

At the relay 3, the backward wave has, relative to the forward wave, on the one hand a significantly attenuated amplitude by virtue of the loss of energy which occurs upon reflection and during propagation of the wave over at least twice the length of the protected section, and on the other hand a significant phase shift, corresponding to the propagation time over at least twice the length of the protected section.

This attenuation and time shift, which appear in the integrals JA1 and JR1 of these power waves, are clearly shown in FIG. 3, in which the integrals of the power waves are shown with arbitrary forms and in which the energies JA1 and JR1 are plotted along positive and negative ordinates respectively.

If SJR1 denotes the mirror-image curve of JR1 about the axis of the abscissa t, the total transient energy which is already dissipated for one phase at time t is given by the difference, positive in sign, between the ordinate of JA1 and that of SJR1 at that time t. FIG. 3 shows clearly that this difference has a relatively large absolute value, such that the sign of this difference can be readily identified.

In contrast, referring now to FIGS. 2 and 4, showing the case where a fault 5 occurs on the protected section, it can be seen that the situation is substantially different.

The directional relay receives first the backward wave R2, to which there corresponds the integral JR2 (in full line in FIGS. 2 and 4), and this wave is reflected by the low impedance 2 to form the forward wave A2, to which there corresponds the integral JA2 (in dashed line in FIGS. 2 and 4). But, bearing in mind that the reflection is then almost total and that the path from the relay 3 to the generator 2 is short, the forward wave passes the relay 3 very shortly after the backward wave and with substantially the same amplitude.

This effect which appears in the integrals JA2 and JR2 of the forward and backward power waves, is illustrated in FIG. 4.

The curves shown in this figure have arbitrary forms and the energies JA2 and JR2 are plotted along positive and negative ordinates respectively.

If SJA2 denotes the mirror-image curve of JA2 about the axis of the abscissa t, the transient energy which is already dissipated for one phase at time t is given by the difference, negative in sign, between the ordinate of JR2 and that of SJA2 at that time t. FIG. 4 shows clearly that this difference has a small absolute value, such that the determination of the algebraic sign of this difference involves a significant risk of error.

The method of the invention consists essentially of delaying the signal representing the forward power wve A2 (in dashed line in FIG. 2) by a period of time between zero and twice the propagation time of a transient power wave along the length of the protected section; preferably, this period of time is chosen equal to this propagation time itself.

The power wave of which this delayed signal is representative has a corresponding time integral or energy JA'2, delayed relative to JA2. If SJA'2 denotes the mirror-image curve of JA'2 about the time axis, the quantity whose algebraic sign is considered to determine the direction of the origin of the fault is, according to the invention, the difference between the corresponding ordinates of the curves JR2 and SJA'2 or any quantity proportional to this difference. As can be seen from FIG. 4 this difference has an absolute value larger than that of the difference between the ordinates of JR2 and SJA2, so the sign can be determined with greater reliability.

It must of course be noted that the delay effectively introduced in the forward wave is also responsible (FIG. 3) for a displacement of the curve JA1 to the curve JA'1 in the case of a fault outside the protected section. This displacement does not however alter the algebraic sign of the difference between the delayed forward wave and the backward wave, since it remains less than the propagation time of a transient power wave along twice the length of the protected section. In fact, since JA'1 is not (FIG. 3) displaced to the right of SJR1, the quantity whose sign is monitored, namely the difference between the corresponding ordinates of JA'1 and SJR1, preserves the same sign. Nonetheless, in order that the absolute value of this difference should be sufficiently large that the determination of its sign should be reliable, it is preferable that the delay introduced is equal or close to the propagation time of a power wave along the length of the protected section, JA'1 then being substantially midway between JA1 and SJR1.

FIG. 5 shows an apparatus arranged to implement the method of the invention in the general case.

This apparatus incorporates, in conventional manner, a current transformer 6 in series with the conductor 1 of the line and a voltage transformer 7 in shunt, and comprises a multiplier 8 for multiplying the output signal I of the current transformer 6 by a predetermined parameter K, an adder 9 and a subtractor 10 for forming respectively the signals V+KI and V−KI, V being the output signal of the voltage transformer 7, filters 11A and 11B for removing from the signals V+KI and V−KI the normal operating frequency of the energy transmission or distribution network, a delay unit 12 for delaying the signal V+KI for example after filtering, function generators 13A and 13B for forming the signals $(V+KI)^2r$ and $(V-KI)^2$ respectively, the suffix r indicating the introduction of a delay, a subtractor 14 for forming the signal $[(V+KI)^2r-(V-KI)^2]$, an integrator 16, having an input resistance 15, for forming the signal $J=\int[(V+KI)^2r-(V-KI)^2].dt$, and a logic circuit 17, comprising two comparators 18 and 19, receiving the signal J on their negative and positive inputs respectively, and a threshold signal S on their positive and negative inputs respectively.

The signal S is provided to allow for the residual value of the signal J in the absence of a fault on the conductor 1. It has been mentioned several times above that the polarity of the total transient energy propagating on the conductor 1 allocated to the transfer of one phase in a polyphase network was, in the case of a fault on that phase, indicative of the direction of the origin of the fault. All the same transient energy also appears, in case of a fault, on the phases which are not faulty, but the polarity of this energy does not provide any indication of the direction of the origin of the fault. It is thus necessary to identify the faulty phase or phases to ensure the validity of the indication of the direction of the origin of the fault. Bearing in mind that the total transient energy appearing on a faulty phase is larger than that which appears on a phase unaffected by the fault, the use of a threshold signal S enables positive activation of one of the outputs 20 and 21 of the comparators 18 and 19 to be obtained only if the fault affects the phase monitored by the transformers 6 and 7. Each output 20 or 21 which is positively activated corresponds to one direction to the origin of the fault relative to the measuring point M where the transformers 6 and 7 are located.

The parameter K is set at a value equal to that of the characteristic impedance of the line, so that the signals V+KI and V−KI represent voltages the squares of which are proportional to powers corresponding to the forward and backward waves respectively.

Those skilled in the art will understand, from reading the above description, that the filters 11A, 11B and the delay unit 12 can be disposed elsewhere in the circuit described, the filter 11A and the unit 12 for example being interchanged.

FIG. 6 shows an apparatus for implementing the method of the invention in the particular case of a short line, that is to say having a low distributed capacitance, or more precisely a line the quarter-wave frequency of which is much larger than the bandwidth of the signal used for the determination of the direction of the origin of the fault.

This apparatus includes, besides the parts 11A, 11B, and 15 to 21 described with reference to FIG. 5, a differentiator 22, an adder 23 and a multiplier 24.

The differentiator 22 receives the signal I from the current transformer 6 and produces on its output 25 the signal $$-\left(RI + L\frac{dI}{dt}\right)$$

where R and L are respectively the equivalent resistance and series inductance of a given length of the line, preferably of half the length of the protected section of this line. The adder 23 is coupled at its inputs to the differentiator 22 and to the voltage transformer 7, so that it supplies at its output a signal $$U = V - RI - L\frac{dI}{dt}.$$

This signal U, with the dimensions of a voltage, represents what subsequently will be, or at least would be for a fault-free line on which the same transient power waves were propagating, the voltage, a fraction of which is associated with the forward wave having passed the measuring point M and appearing at a point X on the line spaced from the point M and preferably chosen to be at the mid-point of the protected section.

The filters 11A and 11B eliminate from the signals I and U respectively the normal operating frequency of the network, and the filtered signals I and U are multiplied by the multiplier 24 the output of which supplies the arrangement 15 to 21 described above. The distributed capacitance of the line being negligible, the strength of the transient wave which could have been measured at the point X on the protected section is comparable to the signal I, so the integrator 16 provides a signal representative of the integral of the difference between a forward transient power wave and a backward transient power wave appearing at the same time at different points on the line or, equivalently, at the same point on the line but at different instants, the forward wave being delayed relative to the backward wave.

For the sake of clarity, the above description refers to the detection of disturbances affecting electrical energy transmission lines. Nevertheless the same techniques are applicable to the protection of other parts of electrical energy networks, for example transformers.

Furthermore, although the examples given make use of analogue techniques, digital techniques can also be used. Thus, for example, referring to FIG. 5, analogue to digital converters could be connected to the outputs of the transformers 6 and 7, and the functions of the parts 8 to 19 could be implemented by one or several computers.

We claim:

1. A method for determining, at a measuring point situated at one end of a protected section of an electricity transmission line, the direction relative to that point of the origin of a disturbance affecting the protected section, comprising the steps of:
    (a) measuring the voltage and current of a signal arising as a result of said disturbance at the measuring point and developing voltage and current responsive signals;
    (b) processing by filtering, delaying by a value proportional to the length of the protected section and squaring the voltage and current responsive signals to obtain a first signal;

(c) processing by filtering and squaring the voltage and current responsive signals to obtain a second signal; and (d) combining the first signal and the second signal to produce an output signal having a value representative of the integral of the instantaneous difference between these signals and an algebraic sign indicative of the direction of said disturbance relative to the measuring point.

2. The method of claim 1 wherein the first signal formed in step (b) has the form of $(V+KI)^2$ and the second signal formed in step (c) has the form of $(V-KI)^2$, where V and I are, respectively, the voltage and current measured in step (a) and K is a constant.

3. The method of claim 2 wherein K is substantially equal to the characteristic impedance of the transmission line.

4. The method of claim 1 further including the steps of:

comparing a value of the signal produced in step (d) with a preselected threshold indicative of the residual energy on the transmission line when no disturbance is present; and indicating that a disturbance is present when the value of this signal exceeds the preselected threshold.

5. The method of claim 1 wherein in step (b) the delay is substantially equal to the propagation time of a transient power wave over the protected section.

6. A method for determining, at a measuring point situated at one end of a protected section of an electricity transmission line, the direction relative to that point of the origin of a disturbance affecting the protected section, comprising the steps of:

(a) measuring the voltage and current of a signal arising as a result of said disturbance at the measuring point and developing voltage and current responsive signals;

(b) processing by summing and filtering the voltage and current responsive signals to obtain a first signal;

(c) filtering the current responsive signal;

(d) multiplying together the first signal and the filtered current responsive signal to obtain a second signal; and (e) integrating said second signal to produce an output signal having an algebraic sign indicative of the direction of said disturbance relative to the measuring point.

7. The method of claim 6 wherein the known characteristics of the protected section comprise inductance and impedance.

8. The method of claim 7 wherein the first signal of step (b) is equal to $V=RI-L\cdot dI/dt$, where V and I are, respectively, the voltage and current measured in step (a), R is the characteristic impedance of the protected section, and L is the characteristic inductance of the protected section.

9. The method of claim 6 wherein the point spaced from the measuring point is located at substantially the mid-point of the protected section.

10. The method of claim 6 wherein the electricity transmission line has negligible distributed capacitance.

11. A method for determining, at a measuring point situated at one end of a protected section of an electricity transmission line, the direction relative to that point of the origin of a disturbance affecting the protected section, comprising the steps of:

(a) measuring the voltage V and current I of a signal arising as a result of said disturbance at the measuring point and developing voltage and current responsive signals;

(b) processing the voltage and current responsive signals to obtain a first signal having a form $(V+KI)^2$, wherein K is substantially equal to the characteristic impedance of the transmission line;

(c) imparting to the first signal a delay proportional to the length of the protected section;

(d) processing the voltage and current responsive signals to obtain a second signal having the form $(V+KI)^2$; and (e) processing the delayed first signal and the second signal to produce an output signal having an algebraic sign indicative of the direction of said disturbance relative to the measuring point.

* * * * *